(12) United States Patent
Chua et al.

(10) Patent No.: US 7,318,651 B2
(45) Date of Patent: Jan. 15, 2008

(54) FLASH MODULE WITH QUANTUM DOT LIGHT CONVERSION

(75) Inventors: Janet Bee Yin Chua, Penang (MY); Klan Shin Lee, Penang (MY); Kee Yean Ng, Penang (MY)

(73) Assignee: Avago Technologies ECBU IP (Singapore) Pte. Ltd., Singapore (SG)

(*) Notice: Subject to any disclaimer, the term of this patent is extended or adjusted under 35 U.S.C. 154(b) by 209 days.

(21) Appl. No.: 11/010,206

(22) Filed: Dec. 10, 2004

(65) Prior Publication Data

US 2005/0135079 A1 Jun. 23, 2005

Related U.S. Application Data

(63) Continuation-in-part of application No. 10/966,534, filed on Oct. 14, 2004, now Pat. No. 7,102,152, which is a continuation-in-part of application No. 10/742,310, filed on Dec. 18, 2003.

(51) Int. Cl.
*G03B 15/02* (2006.01)

(52) U.S. Cl. .......... 362/11; 362/231; 362/260; 362/293; 362/800; 257/89; 257/98; 313/500; 313/501; 313/502

(58) Field of Classification Search ............ 362/12, 362/13, 231, 260, 293, 800, 11; 257/14, 257/89, 98; 313/500–504; 348/370, 371; 396/155
See application file for complete search history.

(56) References Cited

U.S. PATENT DOCUMENTS

| | | |
|---|---|---|
| 5,016,046 A | 5/1991 | Nishiyama |
| 5,067,049 A | 11/1991 | Milaire |
| 5,117,118 A | 5/1992 | Fukuyama |
| 5,477,326 A | 12/1995 | Dosmann |
| 5,722,755 A | 3/1998 | Slape |
| 5,758,942 A | 6/1998 | Fogal et al. |
| 5,815,204 A | 9/1998 | Abe et al. |
| 5,895,128 A | 4/1999 | Kishimoto et al. |
| 5,909,245 A | 6/1999 | Aoki et al. |
| 6,277,301 B1 | 8/2001 | Hohn et al. |
| 6,344,641 B1 | 2/2002 | Blalock et al. |
| 6,379,022 B1 | 4/2002 | Amerson et al. |
| 6,448,550 B1 | 9/2002 | Nishimura |

(Continued)

FOREIGN PATENT DOCUMENTS

| | | |
|---|---|---|
| DE | 100 31 303 A1 | 1/2002 |
| DE | 100 55 767 A1 | 8/2002 |

(Continued)

OTHER PUBLICATIONS

U.S. Appl. No. 10/966,534, Device and Method for Emitting Output Light Using Quantum Dots and Non-Quantum Fluorescent Material, filed Oct. 14, 2004 by Janet Bee Yin Chua, Kok Chin Pan, Kee Yean Ng, Kheng Leng Tan, and Tajul Arosh Baroky.

(Continued)

*Primary Examiner*—Stephen F Husar

(57) ABSTRACT

A flash module includes a first light source emitting a first primary light has a first wavelength-converting overlay disposed on the first light source to provide a first color of light. The first wavelength-converting overlay includes a first plurality of quantum dots dispersed in a matrix material. The flash module also includes a second light source providing a second color of light.

25 Claims, 2 Drawing Sheets

U.S. PATENT DOCUMENTS

| | | | |
|---|---|---|---|
| 6,501,091 B1 * | 12/2002 | Bawendi et al. | 257/14 |
| 6,636,003 B2 | 10/2003 | Rahm et al. | |
| 6,664,556 B2 | 12/2003 | Doberenz | |
| 6,781,329 B2 | 8/2004 | Mueller | |
| 6,803,719 B1 * | 10/2004 | Miller et al. | 313/501 |
| 6,864,749 B2 | 3/2005 | Seetharaman et al. | |
| 6,894,266 B2 | 5/2005 | Richard et al. | |
| 6,909,377 B2 | 6/2005 | Eberl | |
| 7,005,667 B2 * | 2/2006 | Chen et al. | 257/14 |
| 7,102,152 B2 * | 9/2006 | Chua et al. | 257/14 |
| 7,106,378 B2 | 9/2006 | Kawakami | |
| 2002/0191102 A1 | 12/2002 | Yuyama et al. | |
| 2003/0052992 A1 | 3/2003 | Nakata | |
| 2003/0123873 A1 | 7/2003 | Okubo | |
| 2003/0127659 A1 | 7/2003 | Bawendi et al. | |
| 2003/0127660 A1 | 7/2003 | Bawendi et al. | |
| 2003/0180037 A1 * | 9/2003 | Sommers | 396/155 |
| 2004/0245912 A1 | 12/2004 | Thurk et al. | |
| 2005/0134723 A1 | 6/2005 | Lee et al. | |
| 2005/0135079 A1 | 6/2005 | Chua et al. | |
| 2005/0199784 A1 | 9/2005 | Jaffar et al. | |
| 2006/0002110 A1 | 1/2006 | Dowling et al. | |
| 2006/0176692 A1 | 8/2006 | Lee et al. | |

FOREIGN PATENT DOCUMENTS

| | | |
|---|---|---|
| DE | 102 61 365 A1 | 7/2004 |
| DE | 102 61 428 A1 | 7/2004 |
| DE | 10261365 A1 | 7/2004 |
| DE | 10261428 A1 | 7/2004 |
| EP | 1160883 A2 | 5/2001 |
| EP | 1 176 849 A2 | 1/2002 |
| EP | 1369935 A1 | 5/2003 |
| GB | 2 253 718 A | 9/1992 |
| JP | 2003007103 A | 1/2003 |
| JP | 2003066519 A | 3/2003 |
| JP | 2003215675 A | 7/2003 |
| JP | 2005011628 A | 1/2005 |
| JP | 2006025167 A | 1/2006 |
| WO | WO 2004/060024 A1 | 7/2004 |

OTHER PUBLICATIONS

U.S. Appl. No. 10/742,310, Flash Lighting for Image Acquistion, filed Dec. 18, 2003 by Kian Shin Lee, Janet Bee Yin Chua, Yue Hoong Lau, Teoh the Seah, and Joon Chok Lee.

Evident Technologies, Nanomaterials Catalog v5.0, Nanomaterial Products (August 2004).

German Office Action dated Jan. 31, 2007 involving German Application No. 10 2005 058 877.8-42 (co-pending application).

English translation of German Office Action dated Jan. 31, 2007 involving German Application No. 10 2005 058 877.8-42 (co-pending application).

U.K. Search Report dated Feb. 16, 2005 involving U.K. Application No. GB0427259.7 (co-pending application).

German Office Action dated Mar. 28, 2006 involving counterpart German Application No. 10 2005 045 106.3-33.

English translation of German Office Action dated Mar. 28, 2006 involving counterpart German Application No. 10 2005 045 106. 3-33.

UK Search Report dated May 31, 2006 involving U.K. Application No. GB0602430.1 (co-pending application).

* cited by examiner

FLASH MODULE WITH QUANTUM DOT LIGHT CONVERSION

CROSS-REFERENCE TO RELATED APPLICATIONS

This patent application is a continuation-in-part of commonly owned U.S. patent application Ser. No. 10/966,534, entitled DEVICE AND METHOD FOR EMITTING OUTPUT LIGHT USING QUANTUM DOTS AND NON-QUANTUM FLUORESCENT MATERIAL, filed Oct. 14, 2004, now U.S. Pat. No. 7,102,152, by Janet Bee Yin Chua, Kok Chin Pan, Kee Yean Ng, Kheng Leng Tan, and Tajul Arosh Baroky, the disclosure of which is hereby incorporated by reference in its entirety for all purposes. This patent application is also a continuation-in-part of commonly owned U.S. patent application Ser. No. 10/742,310, entitled FLASH LIGHTING FOR IMAGE ACQUISITION, filed Dec. 18, 2003 by Kian Shin Lee, Janet Bee Yin Chua, Yue Hoong Lau, Teoh The Seah, and Joon Chok Lee, the disclosure of which is hereby incorporated by reference in its entirety for all purposes.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

The invention relates to light-emitting diode ("LED") devices, and more particularly to LED devices that mix light from a number of LEDs to produce white light.

Light is fundamental to imaging, and the nature of light affects the resultant image quality. For example, the color of a light source used in imaging can affect the hue of the image. The color of a light source is often characterized by its color temperature and its color rendering index ("CRI"). Color temperature is an indication of the light provided by the light source compared to light that would be emitted by a black body radiator at a certain temperature. For example, a 100-Watt incandescent bulb has a color temperature of about 2870 degrees Kelvin, which means the light emitted by the incandescent bulb is about the same color (generally yellowish-white) as a black body heated to 2870 degrees Kelvin.

Color temperature is useful for determining the correct type of film to use in photography, and for specifying the right light source types for imaging applications. For example, daylight film is color balanced (i.e. will accurately reproduce the color of a subject in an image) when used with a light source having a color temperature of 5,500 degrees Kelvin, such as daylight or light from a strobe light. Tungsten film is color balanced when used with a light source having a color temperature of about 3,200 degrees Kelvin, which is an orange light often described as "warm." Stage lighting, flood lighting, and home lighting are typically warm light sources. If such light sources are used to illuminate a subject imaged with daylight film, the image will often have an orange cast. Similarly, if tungsten film is used to image a subject illuminated by strobe lights or daylight, the image will appear bluish.

However, light sources of the same color temperature can vary widely in the quality of light emitted. One may have a continuous spectrum, while the other just emits light in a few narrow bands of the spectrum, yet both have the same color temperature. A useful way to determine the quality of a light source is its CRI. To determine a CRI value, observers view 8 standard pastel colors under the light source being rated and under light from a blackbody source (such as an incandescent lamp) having the same color temperature. The CRI is calculated, roughly speaking, by averaging the observers' estimation of the extent of the differences in the appearance of the colors under the two lights. The CRI can only be used to compare two light sources that have the same color temperature. It serves as a quality distinction between light sources emitting light of the same color. The highest CRI attainable is 100.

Electronic flash tubes have been used by photographers since the 1950s to illuminate a subject when making an image on film or with a digital imaging device. A typically electronic flash tube has a gas, such as xenon, or combination of gasses, inside a tube with electrodes on both ends and a metal trigger plate in the middle of the tube. A voltage is applied to the electrodes to ionize the gas in the flash tube. Electrons flow through the ionized gas and excite the gas ions, which emit visible light. The emitted light is typically in a very narrow band of wavelengths corresponding to the atomic transition levels in the gas. Hence, the light emitted from a flash tube is essentially fixed.

An LED is a semiconductor device capable of emitting light when an electric current flows through it. LEDs are used in many applications, such as electronic displays, traffic signals, and video signs. LEDs emit monochromatic light. One way to characterize the light output of an essentially monochromatic source is by the full-width half maximum ("FWHM") value of the emitted light. The FWHM is the width of the spectrum taken halfway from the maximum (peak) emission. The FWHM of light emitted by an LED falls within a narrow range, typically about 20-50 nanometers ("nm"). In some applications, a phosphor is applied to the LED to broaden the FWHM and shift the peak wavelength of the emitted light.

LED flash modules, such as are used in or with cameras, digital cameras, and camera-containing devices such as mobile telephones and personal digital assistants, use phosphor-converted LEDs to create a "white" flash. The LED flash module typically has one or more blue LEDs (primary emitters) with phosphors (secondary emitters) deposited on the blue LEDs. The spectral content of the flash light is determined by the secondary emissions of the phosphors and primary emissions of the LEDs. Using these techniques, flash modules obtain color temperatures in the range of about 3500 degrees Kelvin to about 8500 degrees Kelvin. However, the CRI is usually only about 65. An LED flash module providing white light with a higher CRI is desirable.

BRIEF SUMMARY OF THE INVENTION

A flash module includes a first light source emitting a first primary light has a first wavelength-converting overlay disposed on the first light source to provide a first color of light. The first wavelength-converting overlay includes a first plurality of quantum dots dispersed in a matrix material. The flash module also includes a second light source providing a second color of light.

DETAILED DESCRIPTION OF THE EMBODIMENTS

Figure 1A:
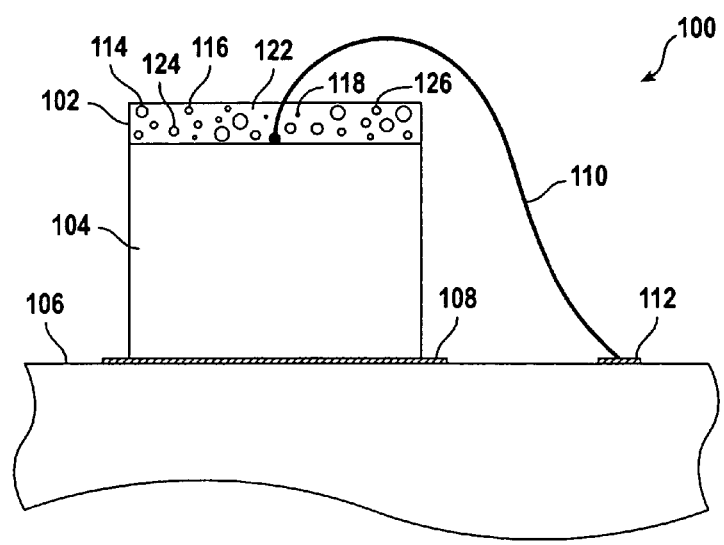
FIG. 1A is a side view of a light-emitting device 100 with a wavelength-converting overlay 102 for use in embodiments of the invention.

FIG. 1A is a side view of a light-emitting device 100 with a wavelength-converting overlay 102 for use with embodiments of the invention. The light-emitting device includes a light source 104, such as an LED chip, mounted on a substrate 106, carrier, or header. Alternatively, another type of light source, such as a semiconductor vertical surface-emitting laser VCSEL is used. The light source 104 is soldered or otherwise attached ("die attached") to a first electrical contact pad 108. A wire bond 110 attaches an electrode (not shown) of the light source 104 to a second electrical contact pad 112. The electrical contact pads 108, 112 are connected to a current supply, which in some embodiments is a variable current supply.

The light source 104 includes an LED (not shown) that emits a relatively narrow range of light. In some embodiments, the LED is a blue LED having a center wavelength less than 450 nm. In other embodiments, the LED has a center wavelength less than 400 nm, and in yet other embodiments, the LED is an ultraviolet ("UV") LED. The center wavelength of the primary emission is chosen so as to excite quantum dots 114, 116, 118 in the wavelength-converting overlay 102 of the LED device 100, and depends on the material chosen for the quantum dots. The sizes of the quantum dots are exaggerated for purposes of illustration.

The wavelength-converting overlay 102 includes a plurality of quantum dots 114, 116, 118 dispersed in a matrix material 122. Suitable matrix materials are generally transparent to the wavelength of light emitted by the LED, and to the wavelengths of light emitted by the quantum dots 114, 116, 118. Examples of matrix materials include polymethylmethacralyate ("PMMA"), polystyrene, polycarbonate, sol-gel, UV-curable resins, and thermosetting resins, such as epoxies. The wavelength-converting overlay 102 is film-coated, cast, drawn, molded or otherwise applied over the light source 104. In some embodiments, some or all of the quantum dots are coated with a material to enhance compatibility with the matrix material and/or to prevent agglomeration or aggregation of the quantum dots in the matrix and/or to stabilize the quantum dots and/or improve their secondary emissions.

Coatings on quantum dots can be organic caps, shells, or caps made of glass material, such as silicon dioxide ($SiO_2$) nano-particles. Organic caps can be formed on quantum dots using $Ag_2S$ and $Cd(OH)_2$, which $Cd^{2+}$ preferentially passivates at high pH. A surface modification of the quantum dots is then performed by attaching organic dye(s) to the passivated surface of the quantum dots. As an example, CdSe surface surfactant is labile and can be replaced by sequential addition of $Se^+$ and $Cd^{2+}$, which can grow to make a seed (i.e. the original quantum dot) larger. For $Cd^{2+}$ rich surface, the surface can be treated with Ph—$Se^-$ and an organic coating is covalently linked to the surface. This isolation of molecular particles is referred to as "capped". Types of known capping molecules include Michelle liquids, sulpher-based thio-terminations, phosphate-terminations, nitrogen-terminations, such as pyridine and pyrazine, and Dendron caps made of multi-stranded ligands.

Shells are coatings on inner core material (quantum dots). Generally, coating materials that form the shells are oxide- or sulphide-based. Examples of shell/core materials include $TiO_2$/CdS, ZnO/CdSe, ZnS/CdS, and $SnO_2$/CdSe. CdSe core material can also be coated with ZnS, ZnSe, or CdS, which significantly improves the efficiency of light conversion by the CdSe.

The quantum dots 114, 116, 118 are very small, typically nanometer-sized, particles of inorganic crystalline material, such as cadmium-selenide ("CdSe"), zinc-sulphide ("ZnS"), cadmium-telluride ("CdTe"), cadmium-sulfide ("CdS"), cadmium-phosphide ("CdPo"), zinc-selenide ("ZnSe"), zinc-telluride ("ZnTe"), zinc phosphide ("ZnPo"), magnesium-sulphide ("MgS"), magnesium-selenide ("MgSe"), magnesium-telluride ("MgTe"), lead-selenide ("PbSe"), lead-sulphide ("PbS"), lead-telluride ("PbTe"), mercury-sulphide ("HgS"), mercury-selenide ("HgSe"), mercury-telluride ("HgTe"), cadimium-selenium-sulphide ("$Cd(S_{1-x}Se_x)$"), or made from a metal oxides group, such as $BaTiO_3$, $PbZrO_3$, $PbZr_zTi_{1-z}O_3$, $Ba_xSr_{1-x}TiO_3$, $LaMnO_3$, $CaMnO_3$, Or $La_{1-x}Ca_xMnO_3$, for example. For example, quantum dots of CdSe are typically between about 1.9 nm (which emit light at about 465 nm±10 nm) and about 6.7 nm (which emit light at about 640 nm±10 nm). The wavelength of the secondary emission of a quantum dot depends on its composition and size.

Normally, quantum dots are carefully sorted by size so that an aggregation of quantum dots emits a single color when suitably illuminated. The narrow emission bandwidth of a quantum dot is desirable in conventional applications because it provides a strong characteristic color. Quantum dots that emit in the visible portion of the spectrum, including core-shell type quantum dots, are available from EVIDENT TECHNOLOGIES, INC. of Troy, N.Y.

However, quantum dots 114, 116, 118 in the wavelength-converting overlay 102 are selected to have different secondary emission wavelengths to produce a broad emission from the light-emitting device 100. In some embodiments, quantum dots are combined in a wavelength-converting overlay with conventional phosphor materials to boost light output in gaps or dips in the output spectrum of a device. In other embodiments, quantum dots are combined in a wavelength-converting overlay with conventional phosphor materials to extend the wavelength range of an LED, such as extending the wavelength in a red LED beyond that which is available with conventional red-emitting phosphors. In yet other embodiments, a distribution of quantum dots are used to broaden an output of an LED where conventional phosphors do not work well, such as using blue-emitting quantum dots in conjunction with a blue emitting LED to broaden wavelength emissions. Such devices are useful in devices where a good CRI is desired because they provide color where it would otherwise be weak or missing, essentially "filling-in" the spectrum of a combined red-green-blue LED device. While quantum dots are often sorted for size to obtain a particular characteristic color, a distribution of sizes are used in embodiments of the invention to broaden the light output from the quantum dots.

In one embodiment, the quantum dots are made of the same material but are of different sizes. Making differently sized quantum dots of the same material is desirable because all the quantum dots can be excited by the same wavelength of light, and the wavelength of the primary emission of the LED is chosen so as to excite the quantum dots in the wavelength-converting overlay.

The wavelength-converting overlay 102 optionally includes conventional phosphor particles 124, 126 dispersed in the matrix 122. Conventional phosphor particles are made of photoluminescent materials that emit light when illuminated (excited) by light having a different, typically shorter, wavelength. Examples of red-emitting phosphors that are excited by blue light include: $CaS:Eu^{2+}$, $Mn^{2+}$ (650 nm); $SrS:Eu^{2+}$ (610 nm); $(Zn,Cd)S:Ag^+$ (600 nm); $Mg_4GeO_{5.5}$: $Mn^{4+}$ (650 nm); and ZnSe:Cu, Cl (620-630). An example of an orange-emitting phosphor excited by blue light is $ZnSeS$: Cu,Cl (590-600 nm). An example of a green-yellow emitting phosphor excited by blue light is $CaS:Ce^{3+}$ (520-580 nm). Examples of green-emitting phosphors excited by blue light include $ZnS:Cu^+$ (550 nm); $SrGa_2S_4:Eu^{2+}$ (535 nm); yttrium-aluminum-garnet ("YAG"): $Ce^{3+}$ (550 nm); and $BaSrGa_4S_7$: Eu (540 nm). An example of a blue-emitting phosphor excited by UV light (about 365-420 nm) is $BaAl_{16}Mg_2O_{27}$ ("BAM") (450 nm). An example of a green-emitting phosphor excited by UV light is ZnS:Cu, Al (540 nm). Examples of red-emitting phosphors excited by UV light include $Y_2O_2S:Eu$ (628 nm) and $Mg_4GeO_{5.5}F:Mn$ (650 nm).

The phosphor particles 124, 126 are typically about one micron to about eighty microns in diameter, more typically about 5 microns to about 30 microns. The non-quantum phosphors may be phosphor particles with or without a silica coating. Silica coating on phosphor particles reduces clustering or agglomeration of phosphor particles when the phosphor particles are mixed with the matrix material. Clustering or agglomeration of phosphor particles can result in a light-emitting device that has a non-uniform color distribution.

In a particular embodiment, blue LEDs are used to excite conventional phosphors and UV LEDs are used to excite quantum dots. In some embodiments, the UV LED has a wavelength-converting overlay that includes quantum dots that fill-in and/or extend the wavelength of one or more of the blue LEDs with the conventional phosphors. For example, a flash module having a red LED providing light over the range of 600 nm to 650 nm is desirable. This is obtainable by combining two conventional phosphors, for example, one having a peak emission at 630 nm and the other having a peak emission at 610 nm, each with a full-width half maximum greater than 50 nm. However, extending the emissions into the deep red portion of the spectrum is difficult using conventional phosphors. Quantum dots of a selected material and size(s) are used to provide a deep red component to the emissions of the red LED. Alternatively, quantum dots emitting at wavelengths greater than 650 nm are included in an overlay on a UV LED operated in conjunction with a wavelength-converted LED device including red-emitting phosphor(s).

Another example is using quantum dots to achieve a broad blue emission with blue LEDs. At color temperatures around 6,500 degrees Kelvin, which is the color temperature of daylight, relatively little blue light is needed. In flash modules using red:green:blue LEDs, a ratio of 3:6:1 is used to produce a color temperature of about 6,500 degrees Kelvin. That is, the peak output power of the green LED is six arbitrary units, the peak output power of the red LED is three arbitrary units, and the peak output power of the blue LED is 1 arbitrary unit. Although it is easy to generate blue light, it is usually over a fairly narrow bandwidth, which affects the CRI achievable by a flash module, particularly at some color temperatures.

Considering the example of a red phosphor excited by a blue LED, the wavelength-converting overlay having a first phosphor with a peak wavelength at 610 nm and a second phosphor with a peak wavelength at 630 nm, the long-wavelength end of the emission spectrum can be boosted and/or extended using quantum dots. For example, with a 50 nm FWHM, the emission at 655 nm (630 nm plus one half the FWHM) is one half of the intensity at 630 nm. Adding quantum dots that emit at 655 and longer wavelengths boost the long-wave emissions, providing a superior CRI for some color temperatures. In one embodiment, quantum dots having discrete size groups are used, such as quantum dots that have emission peaks at 640, 660, and 680 nm, for example.

In an alternative embodiment, the quantum dots have an essentially continuous size distribution, such as from about 4.0 nm to about 4.8 nm. In a particular embodiment, the size distribution is chosen to favor a portion(s) of the spectrum, such as being less in the region where the emissions from the quantum dots overlap the emission from the phosphor, and more in the region where there is little or no overlap of emissions with the conventional phosphor(s). In some embodiments, size distribution is selected to account for variations in quantum yield (conversion efficiency) of different-sized quantum dots. In another embodiment, a plurality of quantum dots includes quantum dots of different materials wherein each of the materials is excited by the primary wavelength of light from the LED. In yet another embodiment, both the size of the quantum dots and the material of the quantum dots are varied within a wavelength-converting overlay.

Unlike the absorption spectrum of a conventional phosphor, which is essentially constant with particle sizes in the range of microns, the absorption spectra of quantum dots of a particular material varies with particle size. In some cases, a large (e.g. red-emitting) quantum dot would absorb light emitted from a smaller (e.g. blue-emitting) quantum dot, which would reduce the blue light output from an LED device having both blue- and red-emitting quantum dots in a wavelength-converting overlay. Therefore, it is desirable to combine quantum dots with phosphors that emit in the same general portion of the spectrum when designing a red, green, blue, or other colored LED device for use in flash or other white-light applications.

In a particular embodiment, the LED emits light in the visible portion of the spectrum, and the wavelength-converting overlay 102 allows some of the light from the LED to contribute to the overall emission spectrum of the LED device 100.

In an alternative embodiment, the loading of the wavelength-converting overlay 102 is essentially complete, and no appreciable amount of light is transmitted through the wavelength-converting overlay. In some embodiments, the LED is lightly loaded so that a portion of the primary emission (i.e. the blue light from a blue LED) is included in the total combined emission of a wavelength-converted LED. In yet another embodiment, the LED is a UV LED, which emits UV light beyond the range of human vision. In that case, it is generally desirable to convert all of the UV primary radiation to secondary radiation because the primary UV emission will not contribute to the visible emission spectrum of the LED device 100 and unconverted UV light may be harmful.

UV LEDs are particularly desirable for illuminating wavelength-converting overlays with a variety of quantum dot materials because the UV light has sufficiently short wavelength to excite a wide variety of quantum dot materials, and the shorter wavelength light is more strongly absorbed by the quantum dots. This enables even inefficient UV LEDs to be desirable as light sources in light-emitting devices with a wavelength-converting overlay that includes different types of quantum dots. A UV light source also offers greater design freedom when choosing quantum dot materials.

In alternative embodiments, the LED used to excite the quantum dots of a wavelength-converting coating of a light emitting device has a peak wavelength not greater than 400 nm. Generally, the quantum dots have higher absorption at shorter wavelengths, and thus produce more intense secondary radiation with shorter-wavelength light sources. However, light having a wavelength of 400 nm is at the edge of the visible spectrum and the primary radiation that is not absorbed by the wavelength-converting overlay does not strongly contribute to the CRI of an array of light-emitting devices. Blue secondary emitters, such as blue quantum dots or blue phosphor, are desirable in some embodiments to improve the CRI of the total combined emission when using light sources with peak wavelengths around 400 nm.

Figure 1B:
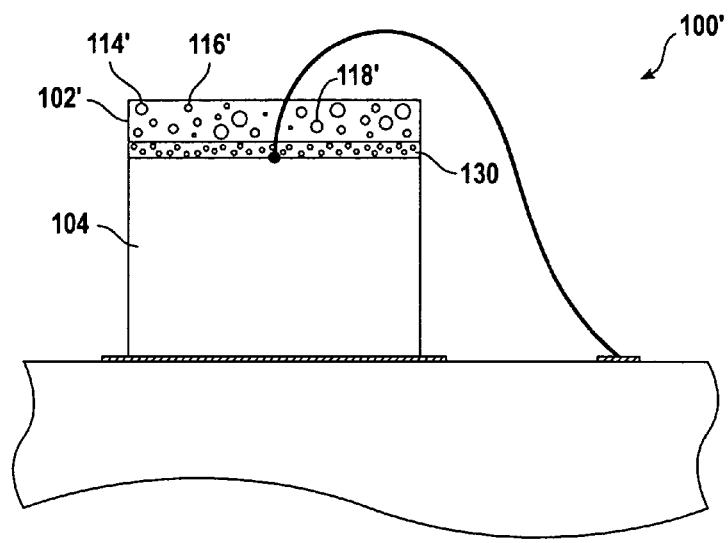
FIG. 1B a side view of another light-emitting device with a wavelength-converting overlay in combination with a conventional phosphor layer for use in embodiments of the invention.

FIG. 1B is a side view of a light-emitting device 100' with a first wavelength-converting overlay 102' in combination with a second wavelength-converting overlay 130 according to another embodiment of the invention. The second wavelength-converting overlay 130 is layer of conventional phosphor material dispersed in a matrix. In a particular embodiment, the second wavelength-converting overlay 130 includes wavelength-converting material(s) that emit second radiation having a wavelength(s) that are not strongly absorbed by the quantum dots 114', 116', 118' in the wavelength-converting coating 102'. The second wavelength-converting overlay 130 lightly loads the light source 104 to allow primary light to be transmitted through the second wavelength-converting overlay 130 to excite the quantum dots 114', 116', 118' in the first wavelength-converting overlay 102'.

In another embodiment, the upper wavelength-converting overlay includes conventional phosphor(s), and the lower wavelength-converting overlay includes quantum dots emitting light that is not substantially absorbed by the upper wavelength-converting overlay. In a further embodiment, the light is visible light and some portion of the light transmitted through the conventional phosphor layer is also transmitted through the wavelength-converting coating, and contributes to the combined emission spectrum of the light-emitting device 100'. It is desirable that the converted (secondary) light emitted by lower wavelength-converting overlay is not substantially absorbed by the upper wavelength-converting overlay.

Placing the conventional phosphor layer between the quantum-dots and the light source avoids re-absorption of the secondary radiation from the quantum dots by the conventional phosphor. Alternatively, quantum dots emitting light with a long peak wavelength are placed "under" (i.e. between the light source and the other quantum dots) quantum dots having a shorter peak wavelength to avoid re-absorption of the shorter wavelength secondary emissions by the longer-wavelength quantum dots.

Figure 2:
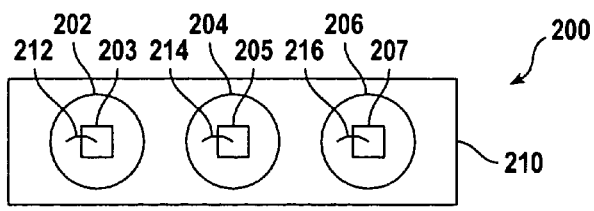
FIG. 2 shows a flash module according to an embodiment of the invention.

FIG. 2 shows a flash module 200 according to an embodiment of the invention. A plurality of LED devices 202, 204, 206 is operated to generate essentially white light from the flash module 200. Each LED device includes an LED chip 203, 205, 207, which are electrically connected to a carrier 210 with bond wires 212, 214, 216. Bonding pads and electrical traces are omitted for simplicity of illustrations. The first LED device 202 is a blue LED or a blue wavelength-converted LED or UV LED. The second LED 204 is a green or yellow-green wavelength-converted LED, and the third LED device 206 is a red wavelength-converted LED. In a particular embodiment, each LED device 202, 204, 206 is independently biased so that the light output from each device is selectively controllable to obtain a desired ratio of red:green:blue light. In a particular embodiment, the ratio of red:green:blue light is 3:6:1.

At least one of the LED devices includes quantum dots emitting substantially the color of the LED. For example, the red wavelength-converted LED device 206 includes a red-emitting phosphor with a peak emission wavelength and a FWHM and quantum dots having a peak emission wavelength about one-half or more of the FWHM above the peak emission wavelength of the red-emitting phosphor. This extends the spectrum of the red wavelength converted LED to improve the CRI of flash light from the flash module 200. Alternatively, the other LED devices also include quantum dots. In a particular embodiment, each of the LED devices includes quantum dots.

Blue quantum dots offer spectrum-broadening of light from a blue LED difficult to obtain using blue-emitting phosphor. Quantum dot materials often exhibit an absorption peak (local maxima) relatively close (about 25 nm in some cases) to the emission peak. Thus, primary light from a blue-emitting LED is converted to other blue light having wavelengths about 25 nm longer (and up). Such broadening of the emission spectrum improves the CRI of flash light emitted by the flash module 200.

In operation, the red, green, and blue LED devices are operated in unison so that the light from the flash module appears white. In other words, the red, green, and blue light is mixed to provide light from the flash module that has a desirable color temperature and a high CRI. In a particular embodiment, the color temperature of a flash module is adjustable from about 3,500 degrees Kelvin to about 8,500, by adjusting the relative bias (current) provided to each of the red, green, and blue LED devices during a flash. In a particular embodiment, quantum dots are combined with phosphor material in an overlay of one or more of the LED devices in a flash module to produce selectable color temperatures of between about 3,500 degrees Kelvin and about 8,500 degrees Kelvin with a CRI greater than 65. In particular embodiments, a flash module produces selectable color temperatures of between about 3,500 degrees Kelvin and about 8,500 degrees Kelvin with a CRI greater than 80. In another embodiment, a flash module is controllable to provide a selected color temperature of about 6,500 degrees Kelvin with a CRI of at least 95. For example, if a colder color temperature is desired, the current to the red LED device is increased relative to the blue and green LED devices. Although the color temperature is reduced, light with relatively more red in it is often referred to as "warmer." The combination of quantum dots with conventional phosphors provides a combined total emission from the flash module with a high CRI.

Various quantum dots are excited by a wide range of wavelengths. For example, quantum dots that are excited by blue light are available, as are quantum dots that are excited by UV light. Using quantum dots in a flash module or other light system where a broad range of output wavelengths are desired are capable of emitting different colors, depending on the material and particle size of the quantum dots. By selecting appropriate quantum dots, a combined (mixed) light output having a desired color temperature and a high CRI is achieved. For example, by selecting the spectrum of color produced by a flash module having quantum dots in one or more colored light devices (e.g. a blue, green, or red LED or an LED with color conversion) to match sunlight enables images with true color to be taken. The spectrum is selectable by controlling the size and/or material of the quantum dots.

In a particular embodiment, a flash module has a blue-emitting LED, a blue-emitting LED in combination with blue-emitting quantum dots, a UV LED in combination with blue-emitting quantum dots and/or blue-emitting phosphor; a blue-emitting LED or UV LED in combination with a green- and/or yellow-green-emitting phosphor(s) and optionally green-emitting quantum dots; and a blue-emitting or UV LED with one or more red-emitting phosphors and optionally red-emitting quantum dots. Providing three separate light sources with three different colors (i.e. blue, green, and red) in a flash module is desirable because each color can be individually controlled to produce a selected color temperature. Alternatively, a flash module combines two colors, such as blue and green, in a first light source, and has a red light source. The currents to the first and second light sources are individually controlled to achieve a desired color temperature.

Figure 3:
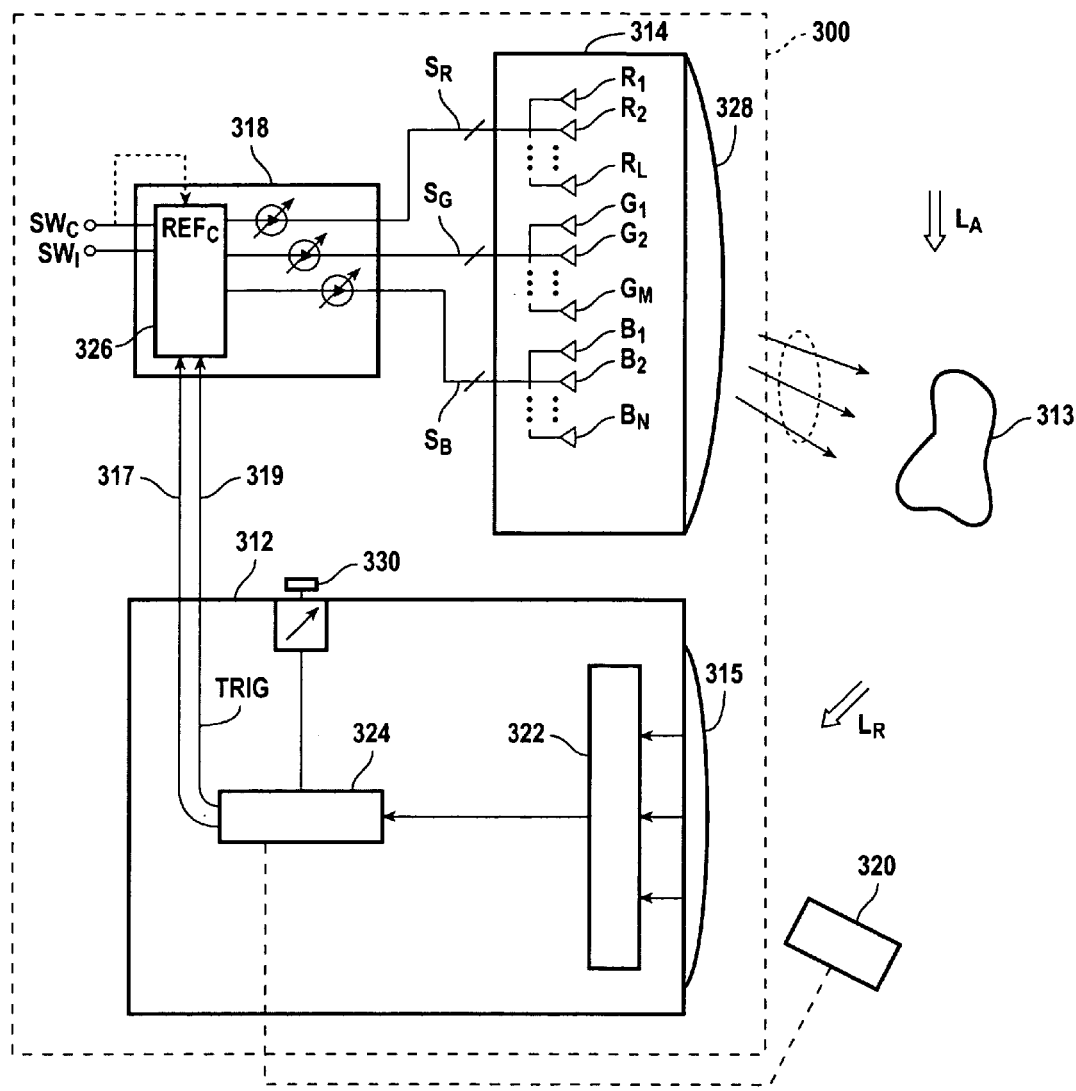
FIG. 3 shows a block diagram of an imaging system according to embodiments of the present invention.

FIG. 3 shows a block diagram of an imaging system 300 according to embodiments of the present invention. The imaging system 300 includes a camera 312 and a light module 314. The light module 314 includes one or more light-emitting devices of one or more selected colors, such as red-, green-, and/or blue-emitting LED devices. At least one light-emitting device has a wavelength-converting overlay with a plurality of quantum dots.

In one embodiment, the light module includes at least one each of a red or red-converted LED R1, R2, $R_N$, a blue or blue-converted LED B1, B2, $B_N$, and a green or green-converted LED G1, G2, $G_N$. In some embodiments, at least one of the colored LEDs includes quantum dots in combination with phosphor. Alternatively, an additional LED, such as a blue LED or a UV LED includes quantum dots emitting one or more colors to fill in or extend the spectrum of the red, blue, and/or green LED. An imaging element 328, such as a lenses and/or reflectors, is optionally included in the light module to control the spatial distribution of light from the light module.

The camera 312 is a digital camera that includes an array of photodetectors 322. Ambient light $L_A$ is imaged onto the photodetector array from a lens 315. An electrical signal(s) from the photodetector array is coupled to a processor 324. The processor 324 is coupled through a link 317 to a driver 318 that provides individually selected current ("drive signals") $S_R$, $S_G$, $S_B$ to the associated light emitters. The driver is incorporated with the light module 314 in a flash unit, or optionally is incorporated in the camera or an external module. The driver 318 includes a series of variable current sources controlled by a control circuit 326. The amount of light ("light output") of a LED depends on the current (i.e. drive signal level) supplied to it. Varying the drive signal of the corresponding light emitter enables selectively tuning the spectral distribution of light from the light module 314 by selectively and independently varying the amount light output from the controllable light sources (LEDs). The processor 324 also provides a trigger signal over a trigger link to initiate a flash $L_F$ from the light module 314 when the camera shutter is activated.

In one embodiment, the electrical signal(s) indicates the color temperature of the ambient light $L_A$ or light reflected $L_R$ from an object 313. Alternatively, the camera is a film-type camera and a separate photodetector 320 measures light from the object 313. The separate photodetector 320 is external to the camera, or alternatively is integrated with the camera. In an alternative or further embodiment, a manual adjustment 330 is provided to allow a user to set the flash module 314 to produce a desired color temperature or to adjust the color temperature otherwise established by the processor 324 according to the ambient light $L_A$ measured by photodetectors. For example, the user might want to decrease the color temperature measured by the photodetectors to impart a warmer tone to an image of the object 313. In yet other embodiments, an imaging system does not include a photodetector and the color temperature of the light module is manually set.

The current supplied to the red LED $S_R$ during discharge (flash) determines how much red light the red LED contributes to the total combined emissions. For example, if the red LED is turned on slightly, the color temperature of the total combined emission is higher than if the red LED is turned on strongly. In a particular embodiment, selectively adjusting the current to the red LED produces a color temperature from about 5,500 degrees Kelvin, which is desirable for use with daylight film, to about 3,200 degrees Kelvin, which is desirable for use with tungsten film.

Other color temperatures are achieved by providing other amounts of current to the red LED or the other LEDs. In other applications, the desired color temperature of the total combined emission of the light module is selected for a desirable photographic effect, such as making a model's complexion "warmer" by reducing the color temperature. Additional colors of LEDs are optionally added to further control the color temperature, and more particularly, the CRI, of the light module.

Figure 4A:
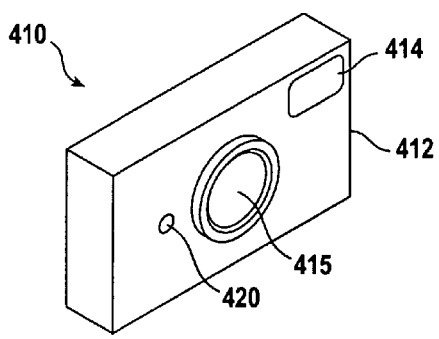
FIG. 4A is an isometric view of an imaging system having a camera, lens, photodetector, and a flash module according to an embodiment of the invention.
Figure 4B:
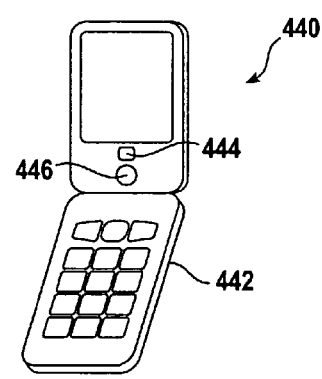
FIG. 4B is an isometric view of an imaging system according to another embodiment of the invention integrated into a mobile telephone.

FIG. 4A is an isometric view of an imaging system 410 having a camera 412, lens 415, photodetector 420, and a flash module 414 according to an embodiment of the invention. Alternatively, the camera includes a photodetector array for imaging and the photodetector 420 is omitted. FIG. 4B is an isometric view of an imaging system 440 according to another embodiment of the invention integrated into a mobile telephone 442. The mobile telephone includes a flash module 444 having at least one light-emitting device including a plurality of types of quantum dots and an imaging lens 446. The imaging lens focuses an image of an object on a photodetector array (not shown) within the mobile telephone. The photodetector array is optionally used to measure a color temperature of the object or of the ambient light. The mobile telephone 442 optionally includes controls for manually setting the color temperature of the flash module 444.

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. A flash module comprising:
   a first light source emitting a first primary light and having a first wavelength-converting overlay disposed on the first light source providing a first color of light, the first wavelength-converting overlay including
matrix material, and
a first plurality of quantum dots dispersed in the matrix material; and
a second light source providing a second color of light;
wherein the second light source emits a second primary light being a third color of light; and wherein the first color of light, the second color of light and at least one of the first primary color of light and the second primary color of light are mixed in the flash module to produce essentially white light having a color temperature of between 3,500 degrees Kelvin and 8,500 degrees Kelvin.

2. The flash module of claim 1 wherein the first wavelength-converting overlay further includes a first phosphor.

3. The flash module of claim 2 wherein the first wavelength-converting overlay further includes a second phosphor.

4. The flash module of claim 1 wherein the white light produced by the flash module has a color rendering index greater than 65.

5. The flash module of claim 1 wherein the white light produced by the flash module has a color rendering index greater than 80.

6. The flash module of claim 1 wherein the first plurality of quantum dots includes a first type of quantum dot emitting a first peak wavelength when excited by the first primary light and a second type of quantum dot emitting a second peak wavelength when excited by the first primary light.

7. The flash module of claim 6 wherein the first type of quantum dot comprises a first type of quantum dot material and the second type of quantum dot comprises a second type of quantum dot material.

8. The flash module of claim 1 wherein at least one of the first light source and the second light source is an ultraviolet light-emitting diode.

9. The flash module of claim 1 wherein the first light source further comprises a second wavelength-converting overlay.

10. A flash module comprising:
a first light source emitting a first primary light and having
a first wavelength-converting overlay disposed on the first light source providing a first color of light, the first wavelength-converting overlay including
matrix material, and
a first plurality of quantum dots dispersed in the matrix material; and
a second light source providing a second color of light;
wherein the second light source emits a second primary light being a third color of light; the first color of light, the second color of light, and the third color of light being mixed in the flash module to produce essentially white light having a color temperature of 6,500 degrees Kelvin and a color rendering index of at least 95.

11. A flash module comprising:
a first light source emitting a first primary light and having
a first wavelength-converting overlay disposed on the first light source providing a first color of light, the first wavelength-converting overlay including
matrix material, and
a first plurality of quantum dots dispersed in the matrix material; and
a second light source providing a second color of light;
wherein the second light source further comprises a second wavelength-converting overlay.

12. The flash module of claim 11 wherein the second wavelength-converting overlay includes a second plurality of quantum dots.

13. The flash module of claim 12 wherein the second wavelength-converting overlay further includes a phosphor.

14. A flash module comprising:
a first light source emitting a first primary light and having
a first wavelength-converting overlay disposed on the first light source providing a first color of light, the first wavelength-converting overlay including
matrix material, and
a first plurality of quantum dots dispersed in the matrix material;
a second light source providing a second color of light; and
a third light source providing a third color of light wherein the flash module mixes light from the first light source, the second light source, and the third light source to provide essentially white light.

15. The flash module of claim 14 wherein the first wavelength-converting overlay further includes phosphor emitting a first light having a first peak wavelength and a full-width half maximum, the first plurality of quantum dots emitting a second light having a second peak wavelength, a difference between the first peak wavelength and the second peak wavelength being at least one half of the full-width half maximum.

16. The flash module of claim 14 wherein the first wavelength-converting overlay further includes a first phosphor emitting a first light having a first peak wavelength and a second phosphor emitting a second light having a second peak wavelength, the first plurality of quantum dots emitting a third light having a third peak wavelength, the third peak wavelength being between the first peak wavelength and the second peak wavelength.

17. The flash module of claim 14 wherein the first wavelength-converting overlay comprises red-emitting phosphor, the second light source includes a second wavelength-converting overlay comprising at least one of a green-emitting phosphor and a yellow-green emitting phosphor, and wherein the third color of light is blue light.

18. The flash module of claim 17 wherein the third light source comprises a blue light-emitting diode.

19. The flash module of claim 18 wherein the third light source further comprises a third wavelength-converting overlay including a second plurality of quantum dots.

20. The flash module of claim 19 wherein the second plurality of quantum dots emit blue light.

21. The flash module of claim 17 wherein the third light source comprises an ultra-violet light-emitting diode and a third wavelength-converting overlay.

22. The flash module of claim 21 wherein the third wavelength-converting overlay includes blue-emitting phosphor.

23. The flash module of claim 22 wherein the third wavelength-converting overlay further includes blue-emitting quantum dots.

24. The flash module of claim 14 wherein the first light source is driven at a first selected current, the second light source is driven at a second selected current, and the third light source is driven at a third selected current to provide white light at a selected color temperature.

25. The flash module of claim 24 wherein the first selected current, the second selected current, and the third selected current are each individually adjustable.

* * * * *